United States Patent
Nam et al.

(10) Patent No.: US 6,723,607 B2
(45) Date of Patent: Apr. 20, 2004

(54) METHOD OF FORMING FINE PATTERNS OF SEMICONDUCTOR DEVICE

(75) Inventors: Dong-Seok Nam, Seoul (KR); Ji-Soo Kim, Yongin-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/440,104

(22) Filed: May 19, 2003

(65) Prior Publication Data

US 2003/0230234 A1 Dec. 18, 2003

(30) Foreign Application Priority Data

Jun. 14, 2002 (KR) .................................... 2002-0033128

(51) Int. Cl.$^7$ .......................................... H01L 21/8234
(52) U.S. Cl. ...................... 438/275; 438/241; 438/258; 438/587
(58) Field of Search ................................ 438/275, 241, 438/258, 587, FOR 218

(56) References Cited

U.S. PATENT DOCUMENTS 5,747,359 A * 5/1998 Yuan et al. ................. 438/657
6,337,262 B1 * 1/2002 Pradeep et al. ............. 438/574
6,613,621 B2 * 9/2003 Uh et al. .................... 438/183

OTHER PUBLICATIONS

Michael S. Hibbs; "IBM Microelectronic Divison"; pp. 104–105; ©1998.

* cited by examiner

*Primary Examiner*—George Fourson
*Assistant Examiner*—Thanh V Pham
(74) *Attorney, Agent, or Firm*—Harness, Dickey & Pierce P.L.C.

(57) ABSTRACT

In the method of forming fine patterns of a semiconductor integrated circuit, a mask layer is formed over a semiconductor structure having a first region and a second region. A portion of the mask layer over the first region is removed to expose the semiconductor structure, and sacrificial layer patterns are formed over the exposed semiconductor structure. Then, spacers are formed on sidewalls of the sacrificial layer patterns and the mask layer, and portions of the spacers are removed to create fine mask patterns. The semiconductor structure is then patterned using the fine mask patterns to create fine patterns.

20 Claims, 13 Drawing Sheets

METHOD OF FORMING FINE PATTERNS OF SEMICONDUCTOR DEVICE

FIELD OF THE INVENTION

The present invention relates to a method of forming a semiconductor device. More particularly, the present invention is directed to a method of forming fine patterns of a semiconductor device.

BACKGROUND OF THE INVENTION

A semiconductor device is formed of material patterns of several types. Forming the material patterns includes etching a lower layer stacked on a semiconductor substrate by using a photoresist pattern as an etch mask. Forming the photoresist pattern includes an exposure process typically using a light having a wavelength of several hundred nanometers. A line width of the pattern, which can be realized by the exposure process, depends on the wavelength of the light. Accordingly, the line width of the material pattern, which can be realized by the typical exposure process, suffers from this limitation.

To solve the foregoing problem, another patterning method using a spacer as an etch mask has been proposed. FIG. 1 is a top plan view showing a prior art patterning method using a spacer as an etch mask. FIGS. 2A through 2C are cross-sectional views taken along a dotted line II—II of FIG. 1. Referring to FIG. 2A, a lower layer 20 and a sacrificial pattern 30 are sequentially formed on a semiconductor substrate 10. Here, the sacrificial pattern 30 is formed by typical photolithography and etching processes. A spacer insulating layer 40 is conformally formed over an entire surface of the semiconductor substrate including the sacrificial pattern 30. As shown in FIG. 2B, the spacer insulating layer 40 is anisotropically etched to form spacers 45 around sidewalls of the sacrificial pattern 30. As shown in FIG. 2C, the sacrificial pattern 30 is removed to expose the lower layer 20. Thereafter, the lower layer 20 is etched by using the spacers 45 as an etch mask. Thus, lower patterns 25 are formed under the spacers 45.

As illustrated in FIG. 1, in the event that the sacrificial pattern 30 has a bar shape, each spacer 45 and lower pattern 25 make a closed loop. Thus, to use the lower pattern 25 in the semiconductor device as a conductor between two or more points, an additional patterning process for removing a predetermined region of the lower pattern 25 is performed such that the lower pattern 25 forms an open loop or line.

FIG. 3 illustrates a top plain view showing a similar patterning method, and FIG. 4 is a cross-sectional view taken along line IV—IV in FIG. 3. As illustrated in FIG. 3, the additional patterning process is also needed when a sacrificial pattern 35 with a bar-shaped opening is formed. In this case, as illustrated in FIGS. 3 and 4, the spacer 45 will form the closed loop to surround the inner sidewalls of the sacrificial pattern 35. Therefore, for the same reason, it is necessary to perform the additional patterning process to obtain an open loop or line.

SUMMARY OF THE INVENTION

In the method of forming fine patterns of a semiconductor integrated circuit, a mask layer is formed over a semiconductor structure having a first region and a second region. A portion of the mask layer over the first region is removed to expose the semiconductor structure, and sacrificial layer patterns are formed over the exposed semiconductor structure. Then, spacers are formed on sidewalls of the sacrificial layer patterns and the mask layer, and portions of the spacers are removed to create fine mask patterns. The semiconductor structure is then patterned using the fine mask patterns to create fine patterns.

By using the mask layer to create exposed region where the sacrificial layer patterns are formed, the sacrificial layer patterns are formed to a same height as the mask layer. If applications of the present invention involve forming patterns from the mask layer, then this further results in the fine mask patterns and the mask layer patterns being at substantially a same height.

BRIEF DESCRIPTION OF THE DRAWINGS

The present invention will become more fully understood from the detailed description given below and the accompanying drawings, wherein like elements are represented by like reference numerals, which are given by way of illustration only and thus are not a limit on the present invention and wherein:

FIGS. 5A through 13A are top plan views showing a patterning method using the spacer as the etch mask according to an exemplary embodiment of the present invention.

FIGS. 5B through 13B are cross-sectional views showing a patterning method using the spacer as the etch mask according to the exemplary embodiment of the present invention.

DESCRIPTION OF THE PREFERRED EMBODIMENT

Figure 1:
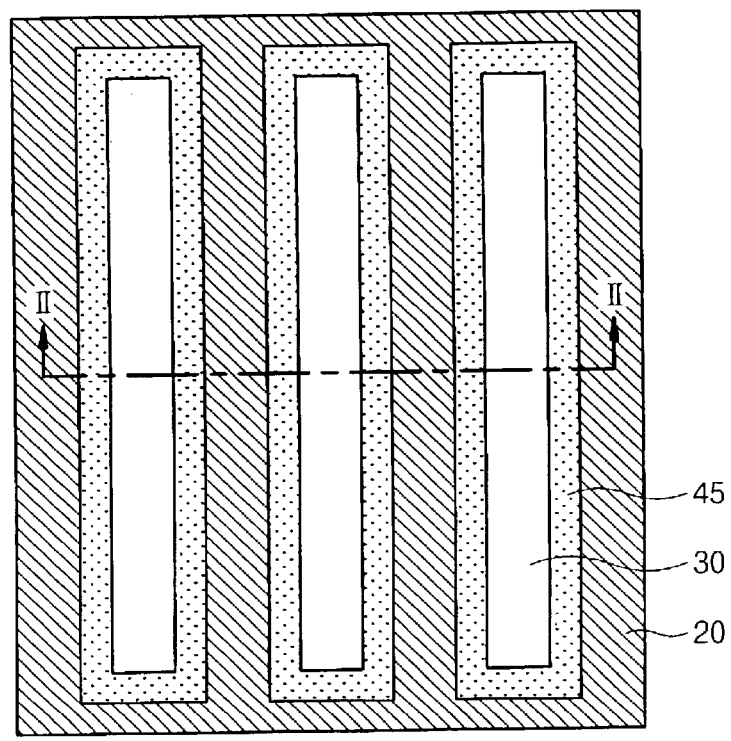
FIGS. 1 and 2A–2C are a top plan view and cross-sectional views showing a prior art patterning method using a spacer as an etch mask.
Figure 2A:
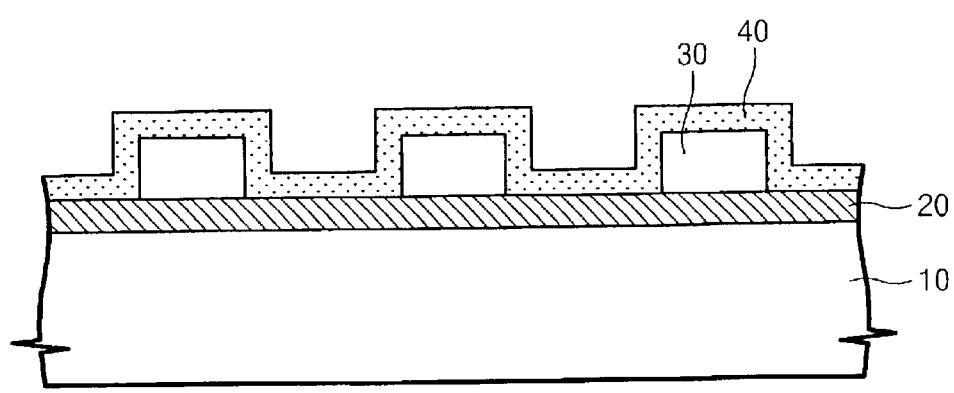
Figure 2B:
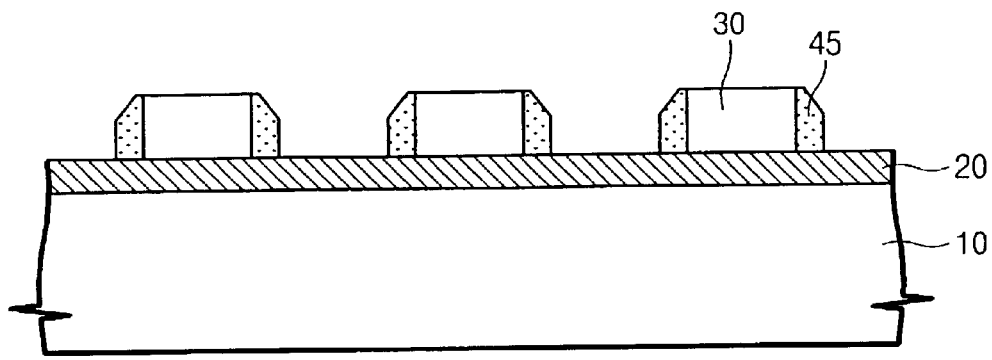
Figure 2C:
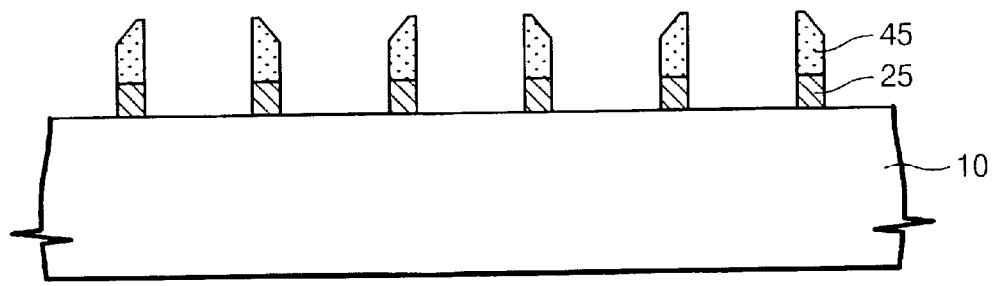
Figure 3:
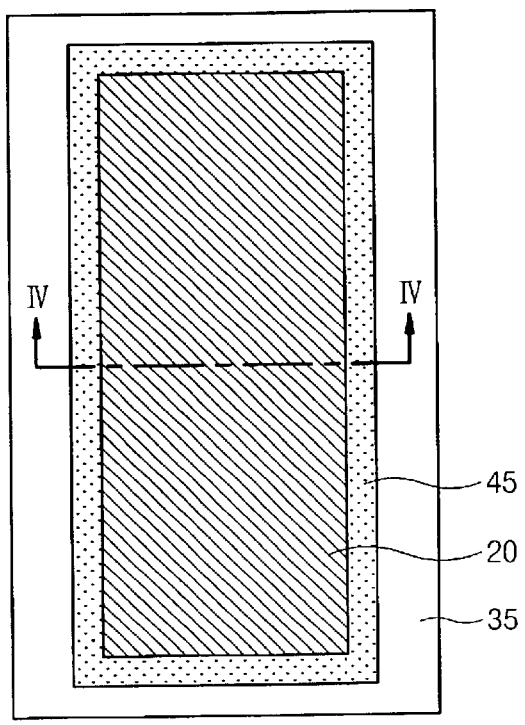
FIGS. 3 and 4 are a top plan view and a cross-sectional view showing another prior art patterning method using a spacer as the etch mask.
Figure 4:
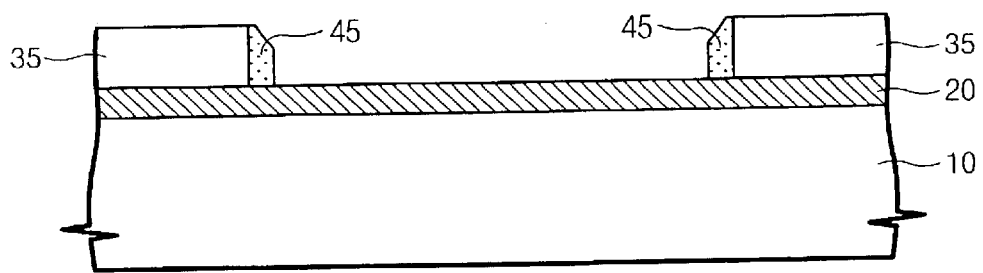

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIGS. 5A–13A and FIGS. 5B–13B are top plan views and cross-sectional views, respectively, showing a method of forming a gate pattern according to an exemplary embodiment of the present invention. Here, FIGS. 5B through 13B represent a cross-section taken along line V—V of FIGS. 5A through 13A, respectively.

Figure 5A:
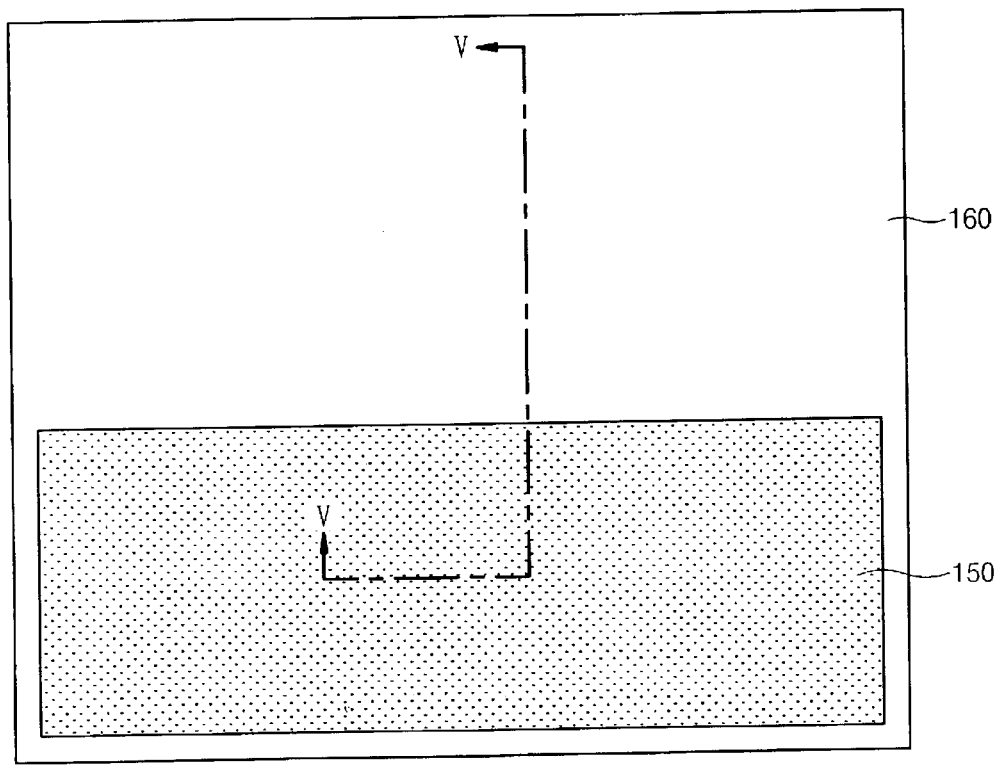
Figure 5B:
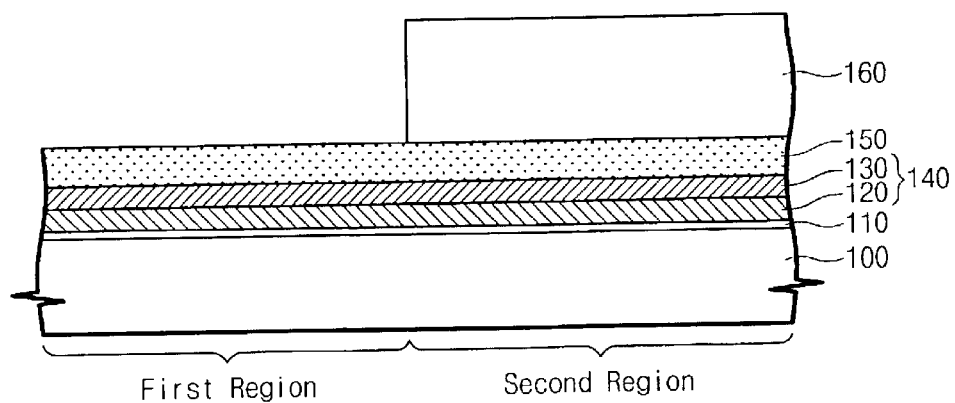

Referring to FIGS. 5A and 5B, a gate insulating layer 110, a gate conductive layer 140 and a mask layer 150 are sequentially stacked on a semiconductor substrate 100. Thereafter, a first photoresist pattern 160 to define first and second regions is formed on the mask layer 150.

Before forming the gate insulating layer 110, a device isolation layer (not shown) defining an active region is further formed at the semiconductor substrate 100. The device isolation layer is formed using, for example, a well-known trench technique. Also, the gate insulating layer 110 is, for example, made of silicon oxide which is formed by thermally oxidizing the active region.

As illustrated in FIG. 5B, the gate conductive layer 140 may have multiple layers where lower and upper conductive layers 120 and 130 are sequentially stacked. According to an exemplary embodiment of the present invention, the upper and lower conductive layers 130 and 120 are formed of a silicide layer and a polysilicon layer, respectively. In addition, the mask layer 150 includes at least one selected from the group consisting of silicon nitride, silicon oxynitride, and silicon oxide.

The first photoresist pattern 160 covers the second region, and simultaneously exposes the mask layer 150 at the first region. According to an exemplary embodiment of the invention, the exposed first region represents a cell array region and the second region represents a peripheral circuit region.

Figure 6A:
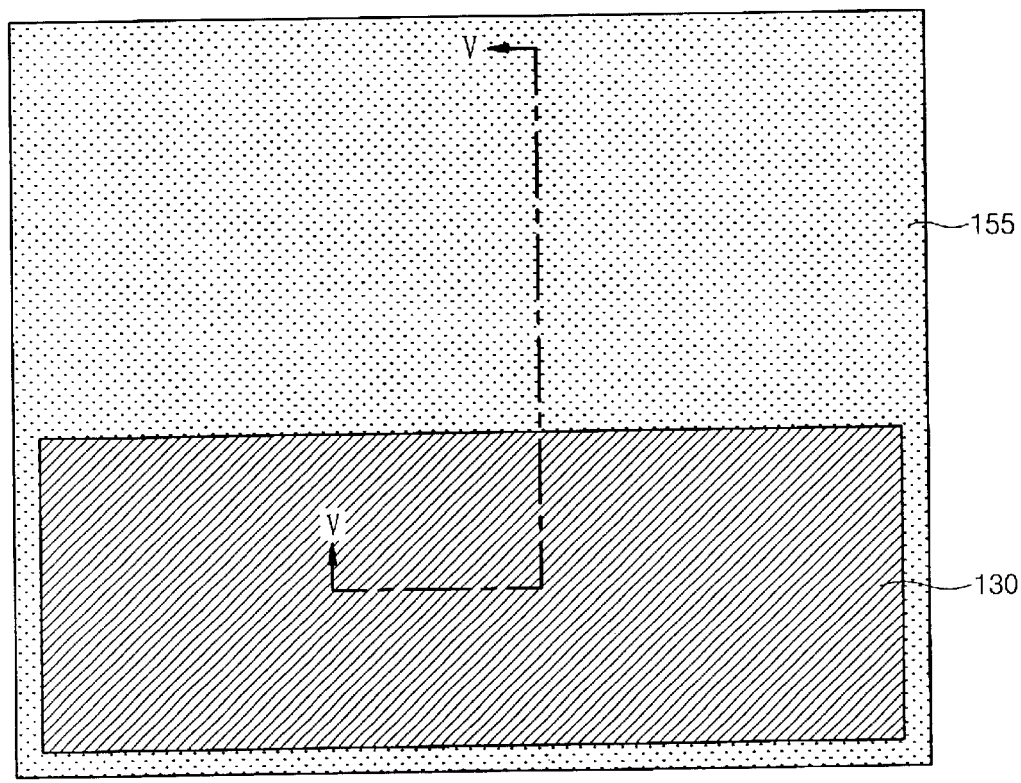
Figure 6B:
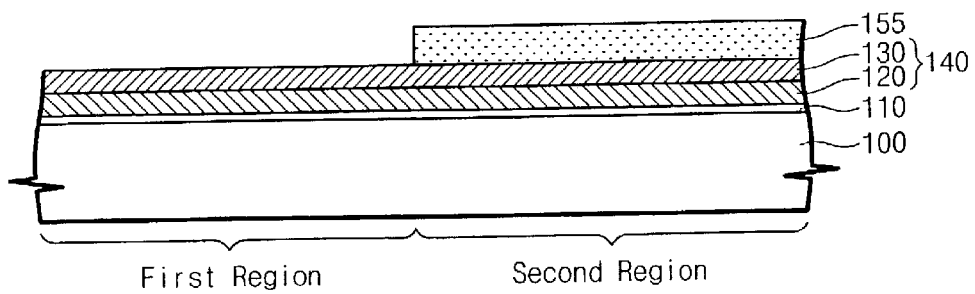

Referring to FIGS. 6A and 6B, the exposed mask layer 150 is etched using the first photoresist pattern 160 as an etch mask, thereby forming a mask pattern 155 and exposing the upper conductive layer 130 at the first region. The mask pattern 155 covers the upper conductive layer 130 at the second region. Continuously, the first photoresist pattern 160 is removed to expose the mask pattern 155 at the second region.

An exemplary etching process for forming the mask pattern 155 is performed using an anisotropic etching process with an etch recipe having an etch selectivity with respect to the upper conductive layer 130. As another example, an isotropic etching process may be used.

By forming the exposed region in the first region as shown in FIG. 6A, subsequently formed sidewall spacers 190 (see FIG. 10B) in the first region will have a same height as the mask pattern 155 in the second region.

Figure 7A:
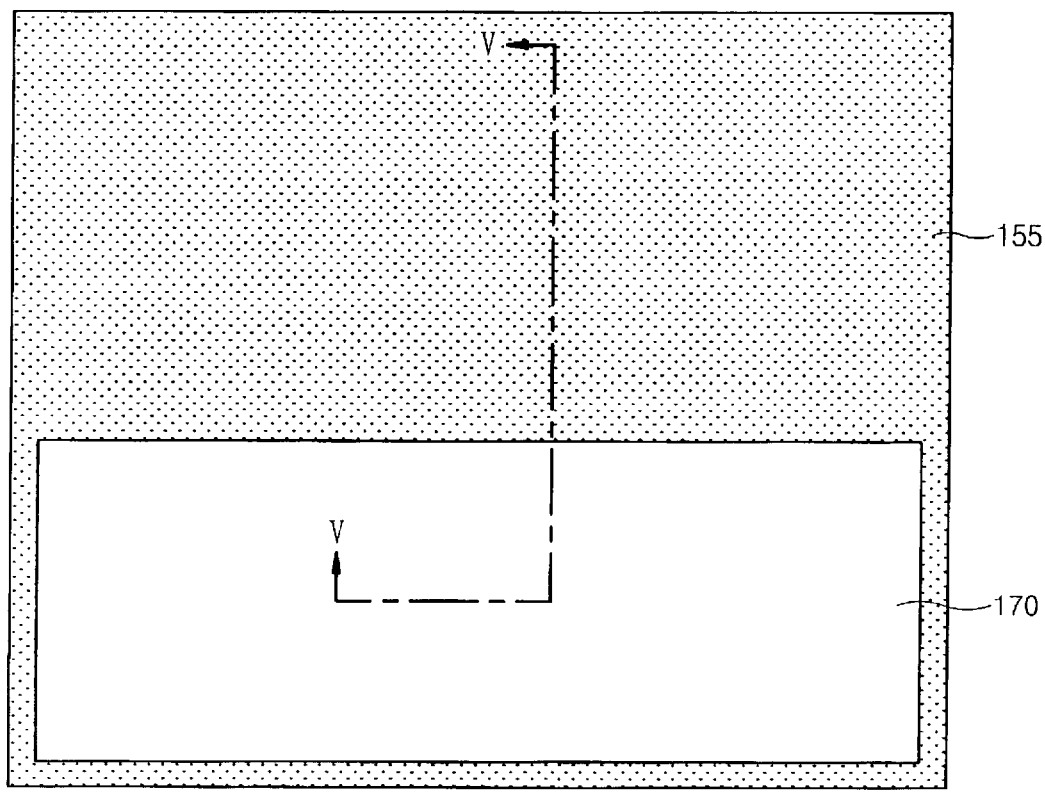
Figure 7B:
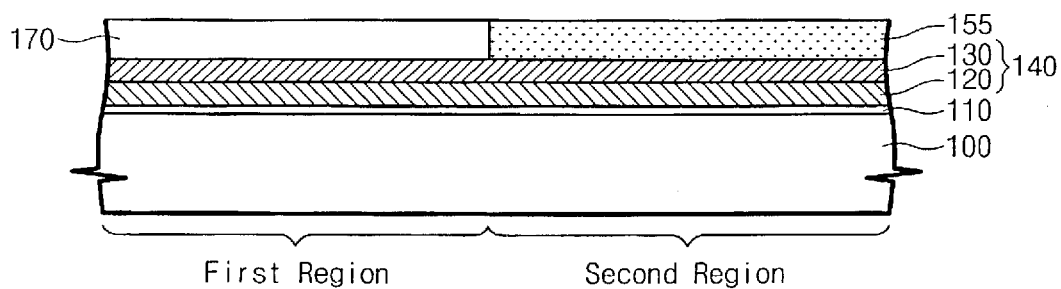

Referring to FIGS. 7A and 7B, a sacrificial layer 170 is formed on an entire surface of the resultant structure where the first photoresist pattern 160 is removed. The sacrificial layer 170 is planarizingly etched until an top surface of the mask pattern 155 is exposed. Thus, the sacrificial layer 170 covers the upper conductive layer 130 at the first region.

The sacrificial layer 170 is formed of a material having the etch selectivity with respect to the upper conductive layer 130 and the mask pattern 155. As explained above, in the case that the mask pattern 155 may be formed of silicon nitride, the sacrificial layer 170 is, for example, formed of silicon oxide. As an example, the planarization etch is performed using a chemical mechanical polishing (CMP) method.

Figure 8A:
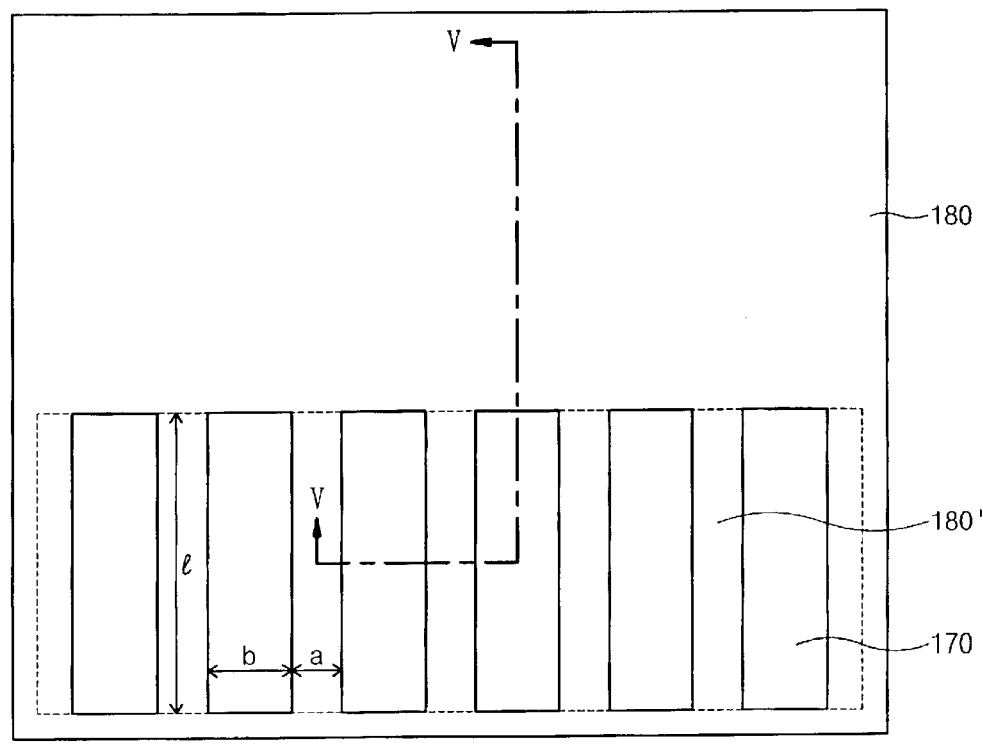
Figure 8B:
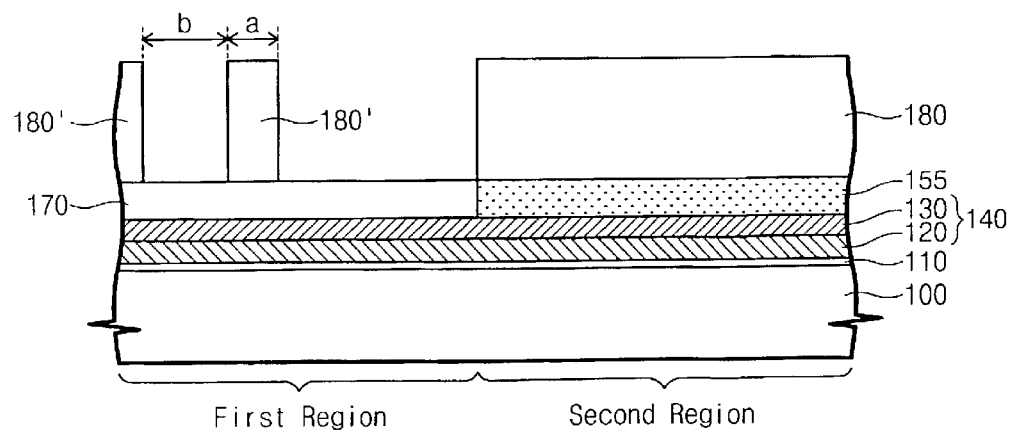

Referring to FIGS. 8A and 8B, a second photoresist pattern 180 covering the entire surface of the second region and including a bar pattern 180' crossing the first region is formed on the sacrificial layer 170.

A width and a spacing of the bar patterns 180' is referenced as 'a' and 'b', respectively, in FIGS. 8A and 8B. The spacing 'b' between the bar patterns 180' is formed wider than the width 'a' of the bar patterns 180' (i.e., b>a). In the case that the later formed gate patterns are formed to an equal spacing, a line width of the gate pattern is defined by half the difference between the spacing 'b' and the width 'a' (i.e., (b−a)/2). Accordingly, the width 'a' and spacing 'b' of the bar patterns 180' are determined taking into consideration a desired line width of the gate pattern to be formed. In an exemplary embodiment, the length 'l' of the bar patterns 180' is the same as or longer than the length of the first region (illustrated as a dotted line). However, the length 'l' of the bar patterns 180' may be shorter than that of the first region.

Figure 9A:
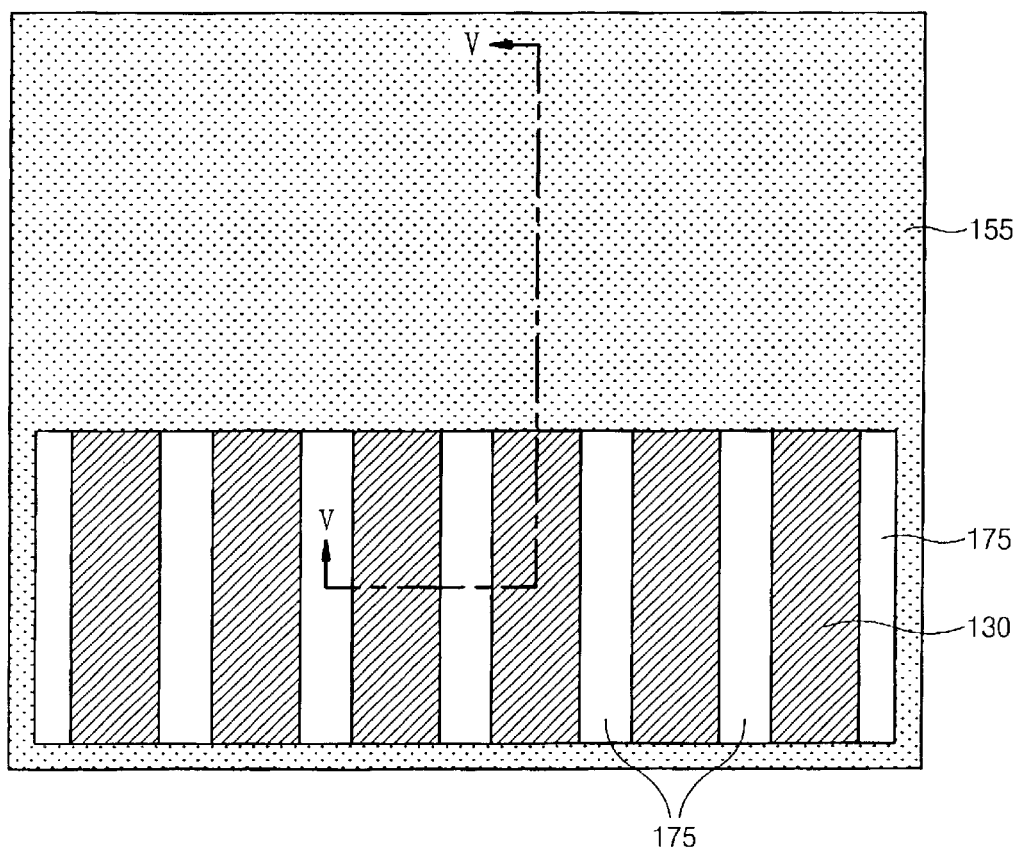
Figure 9B:
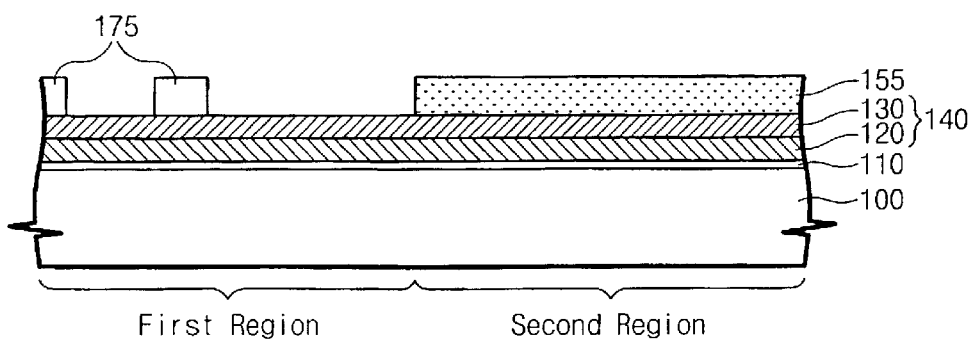

Referring to FIGS. 9A and 9B, the exposed sacrificial layer 170 is etched using the second photoresist pattern 180 as the etch mask, thereby forming sacrificial patterns 175 and exposing portions of the top surface of the upper conductive layer 130. Namely, sidewalls of the sacrificial and mask patterns 175 and 155 define openings exposing the top surface of the upper conductive layer 130. After the sacrificial patterns 175 are formed, the second photoresist pattern 180 is removed to expose the mask pattern 155 at the second region and the sacrificial patterns 175 at the first region.

Here, the etching process for forming the sacrificial patterns 175 is, for example, performed using the anisotropic etch method with the etch recipe having the etch selectivity with respect to the upper conductive layer 130.

Figure 10A:
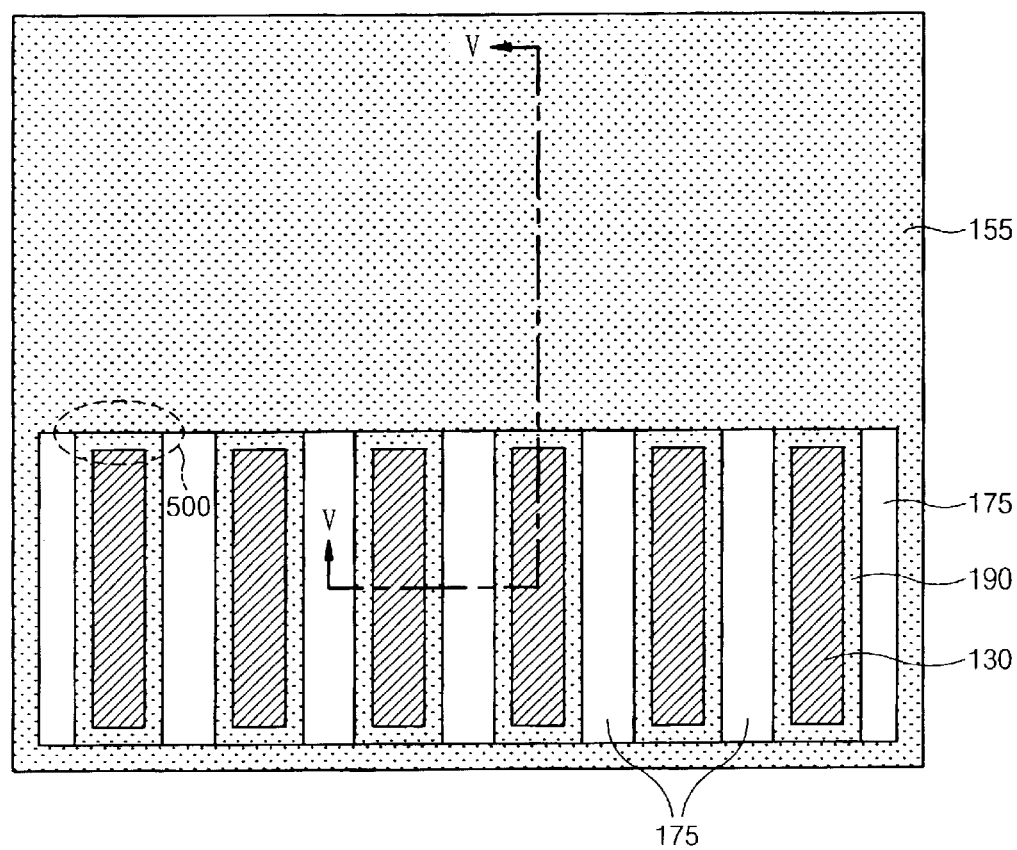
Figure 10B:
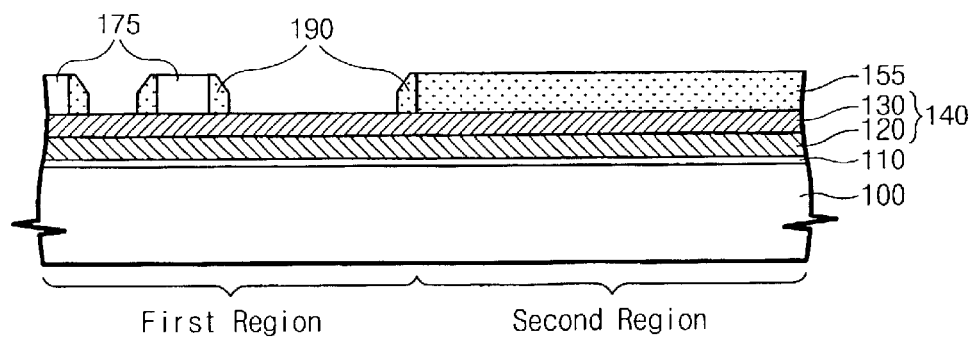
Figure 14:
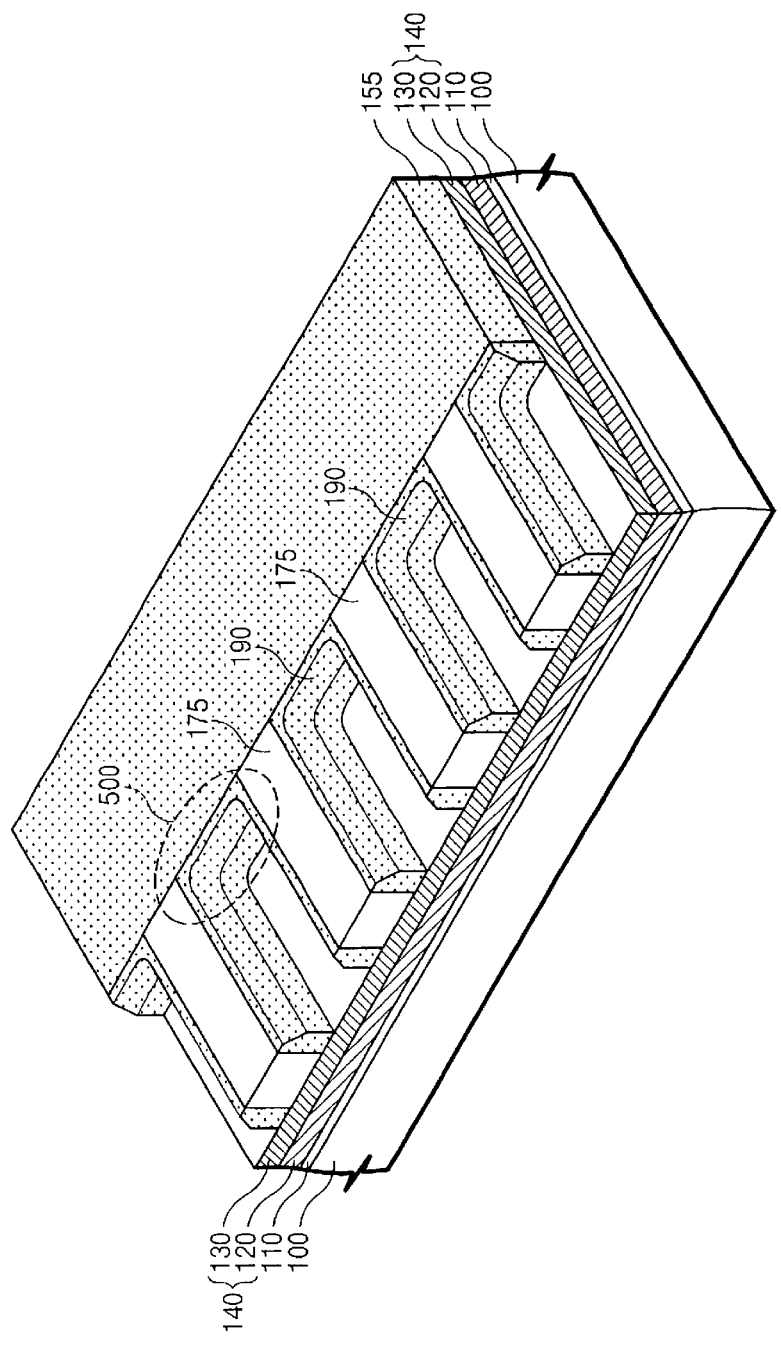
FIG. 14 is a perspective view showing the resultant structure of FIGS. 10A and 10B.

Referring to FIGS. 10A and 10B, after the second photoresist pattern 180 is removed, spacers 190 are formed around sidewalls of the sacrificial patterns 175 and the mask pattern 155 such that portions of the upper conductive layer 130 are exposed. Also, as described above with respect to FIG. 6A, the sidewall spacers 190 have a same height as the mask pattern 155. Namely, patterns formed in the first region have a same height as associated patterns in the second region because of the initial structure created in FIG. 6A. Here, the spacers 190 constitute closed loops defining the opening exposing the upper conductive layer 130. FIG. 14 is a perspective view showing the resultant structure where the spacers 190 form the closed loops.

The process of forming the spacers 190 includes forming conformally a spacer insulating layer on an entire surface of the semiconductor substrate having the sacrificial patterns 175. Thereafter, the top surface of the upper conductive layer 130 is exposed by anisotropically etching the spacer insulating layer. The spacers 190 are formed of a material having an etch selectivity with respect to the sacrificial patterns 175 such that the spacer insulating layer is selectively removed. Also, in an exemplary embodiment, the spacers 190 are formed of a material without etch selectivity with respect to the mask pattern 155. Thus, in the event that the sacrificial patterns 175 are formed of silicon oxide, the spacers 190 are, for example, formed of silicon nitride.

According to the present invention, the line width of the gate pattern is determined in accordance with the width of the spacers 190. Thus, to form a fine gate pattern, in an exemplary embodiment, the width of the spacers 190 is thin. Also, in an exemplary embodiment, the spacer insulating layer is formed using a method of accurately adjusting a thickness of the spacer insulating layer in order to minimize line width variation of the gate patterns to be formed. For the foregoing process, the spacer insulating layer is, for example, formed using an atomic layer deposition (ALD) method, or a typical chemical vapor deposition (CVD) method. The thickness of the spacer insulating layer may be accurately adjusted by using the ALD method in a range between several and several dozen angstroms. Thus, the method of the present invention of using the spacers 190 as the etch mask can provide a method of forming very fine patterns as compared with a typical patterning method of using the photoresist pattern as the etch mask.

As explained above, the spacers 190 form closed loops defining the openings exposing the upper conductive layer 130. To maximize an advantage of using the spacers 190 as the etch mask during the process of forming the gate patterns, a portion of each spacer 190 is preferably removed such that the spacers 190 have an open loop or line shape. According to one embodiment of the present invention, a short side of the spacers 190 is removed as described in detail below.

Figure 11A:
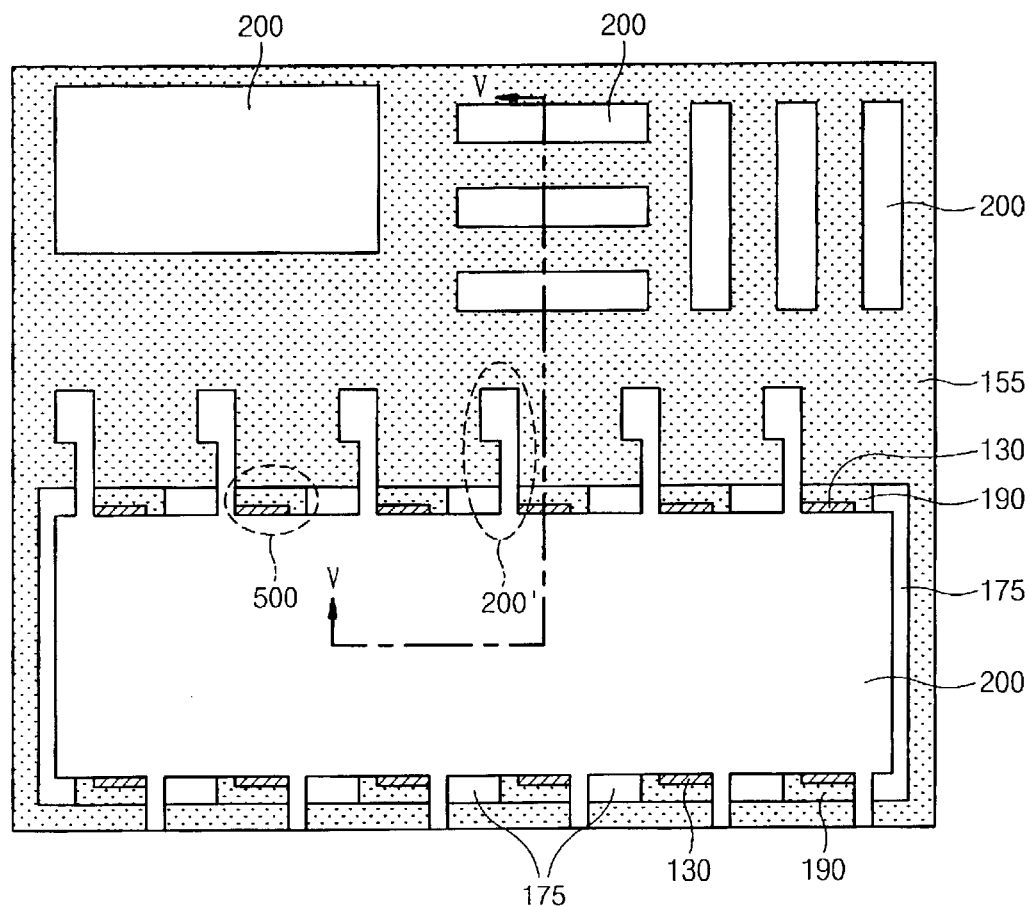
Figure 11B:
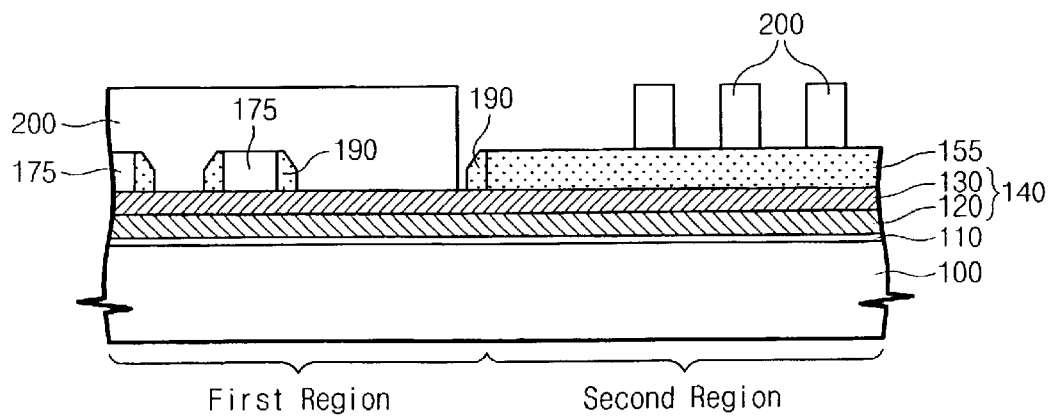

Referring to FIGS. 11A and 11B, a third photoresist pattern 200 as the etch mask for forming the spacers 190 into the open line shape is formed over the semiconductor substrate. Here, the third photoresist pattern 200 defines the gate patterns at the cell region (first region) and peripheral circuit region (second region), and simultaneously defines peripheral devices such as capacitors and resistors at the peripheral circuit region (second region). According to this exemplary embodiment, the third photoresist pattern 200 exposes a short side 500 of the spacers 190 and exposes the mask pattern 155 at predetermined portions of the second region. The exposed portions are etched during a subsequent process. Thus, the peripheral devices are formed under the third photoresist pattern 200 of the second region.

In addition, the third photoresist pattern 200 includes connecting parts 200', each covering a portion of an associated spacer 190 and a portion of the mask pattern 155. Generally, the line width of the spacers 190 is not enough to form a gate contact electrically connected to the gate pattern. The connecting part 200' defines a region where the gate contact will be formed. That is, by use of the connecting part 200', a spacer 190 at the first region where a cell transistor will be formed is connected to a portion of the mask pattern 155 at the second region where the gate contact will be formed.

Figure 12A:
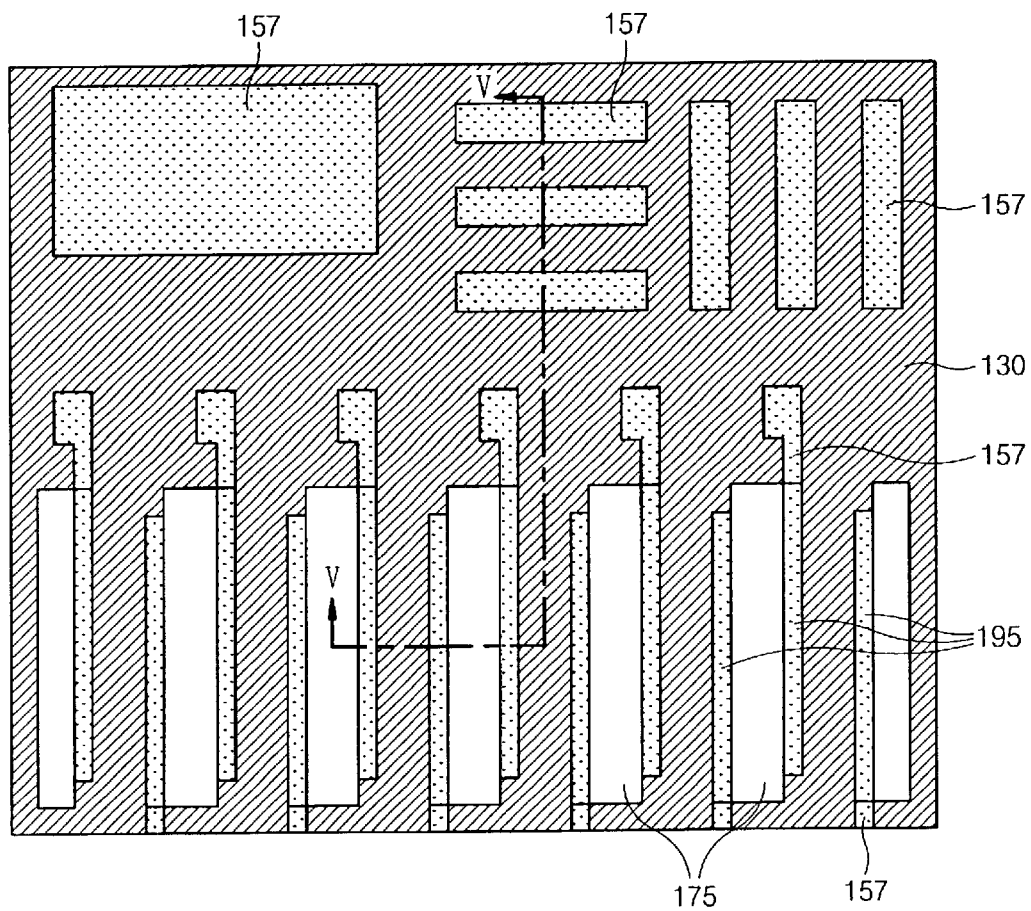
Figure 12B:
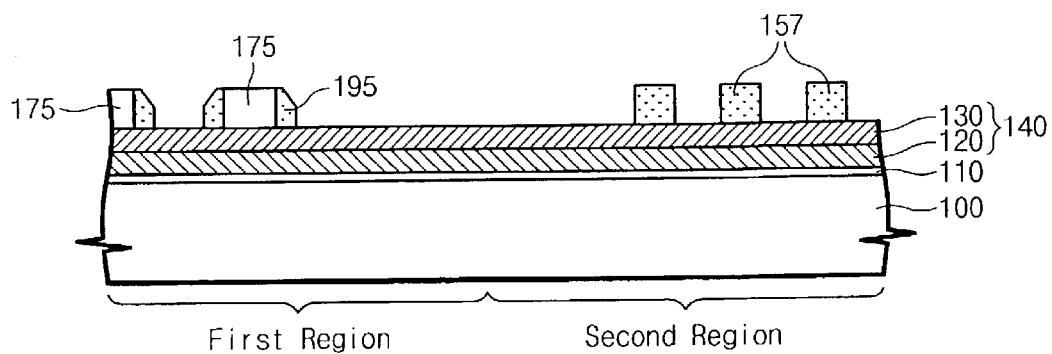

Referring to FIGS. 12A and 12B, the exposed portions of the spacers 190 and the mask pattern 155 are etched by using the third photoresist pattern 200 as the etch mask. The etching process is performed, for example, using the anisotropic etch process having an etch selectivity with respect to the upper conductive layer 130. Accordingly, spacer patterns 195 and peripheral mask patterns 157, which cover portions of the upper conductive layer 130, are formed at the first and second regions, respectively. The spacer patterns 195 have the open line shape. The peripheral mask patterns 157 are used as the etch mask for forming the peripheral devices. Furthermore, under each of the connecting parts 200' of the third photoresist pattern 200, an etch mask is formed in which the spacer patterns 195 and the peripheral circuit mask patterns 157 are respectively coupled to each other. Thereafter, the third photoresist pattern 200 is removed.

Figure 13A:
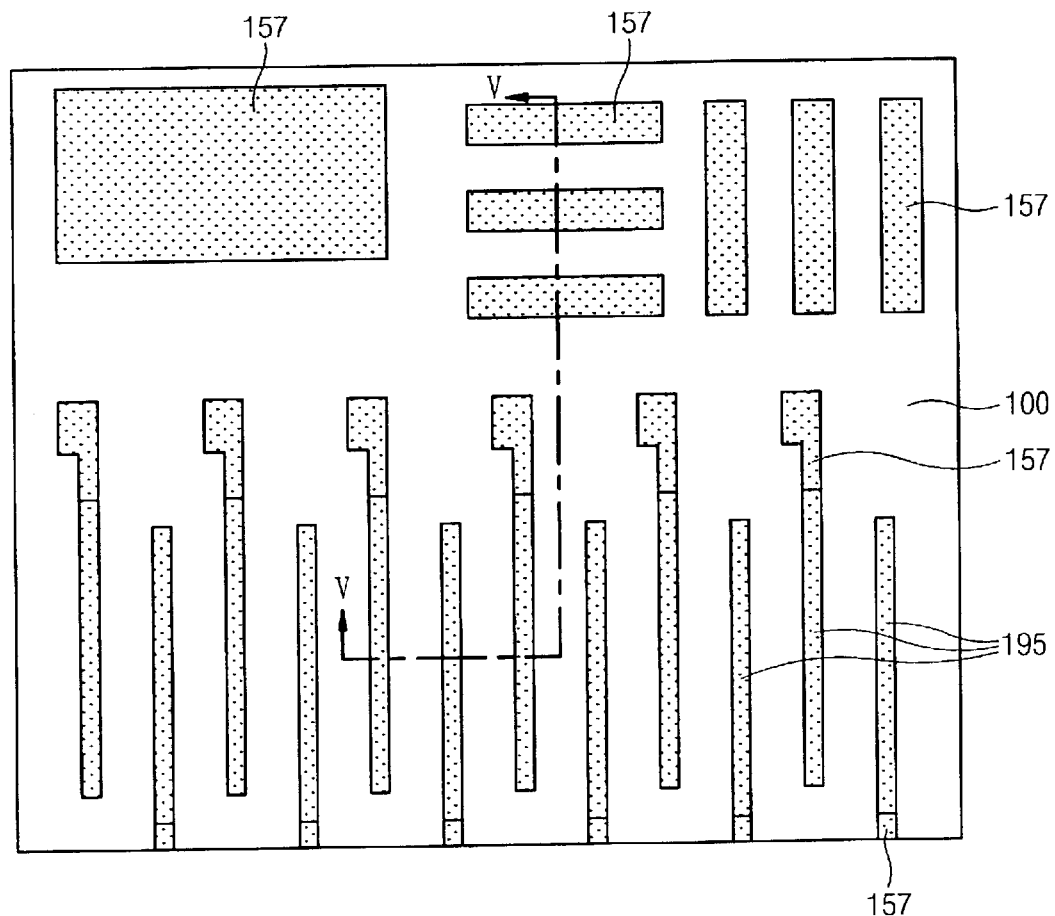
Figure 13B:
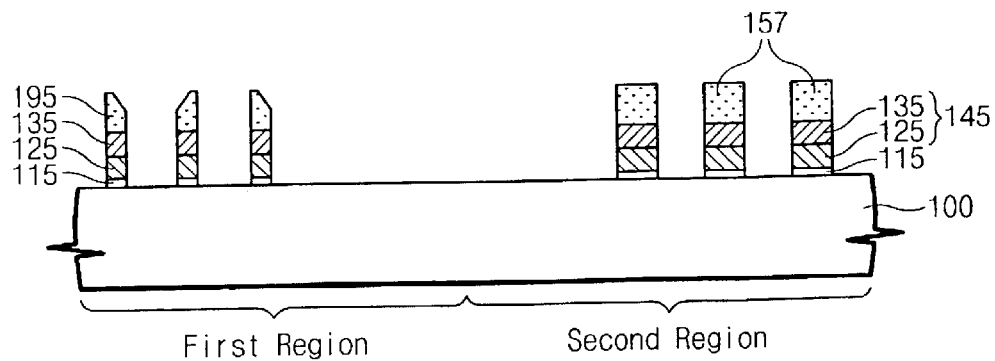

Referring to FIG. 13A and FIG. 13B, after the third photoresist pattern 200 is removed, the sacrificial patterns 175 are removed. The etch recipe used during the removal of the sacrificial patterns 175 has an etch selectivity with respect to the upper conductive layer 130, the spacer patterns 195 and the peripheral mask patterns 157. Also, the process is, for example, performed using the isotropic etching process, or the anisotropic etching process. In the case that the sacrificial patterns 175 are removed by a wet etching process, the spacer patterns 195 and the peripheral mask patterns 157 may fall down because of the surface tension of the enchant. To prevent this problem, removal of the sacrificial patterns 175 may be performed before removing the third photoresist pattern 200.

Once the sacrificial patterns 175 are removed, the gate conductive layer 140 and the gate insulating layer 110 are sequentially patterned using the spacer and peripheral mask patterns 195 and 157 as the etch mask. The patterning process is, for example, performed by the anisotropic etching process using an etch recipe having etch selectivity with respect to the semiconductor substrate 100. Thus, a gate insulating pattern 115 and sequentially stacked lower and upper conductive patterns 125 and 135 are formed between the semiconductor substrate 100 and the etch masks 157 and 195. The lower and upper conductive patterns 125 and 135 form a gate conductive pattern 145.

It will be understood that while the method of forming a fine pattern according to the present invention has been described with respect to the formation of gate patterns, the method of the present invention is not limited to this application. Instead, the method of the present invention may also be applied to a process for forming an interconnection, a process for forming the device isolation layer, etc. In the case of the device isolation layer, the spacer patterns 195 formed according to the method of the present invention are used as the etch mask for forming a trench. In this case, a pad oxide layer typically used during the process of forming the trench is formed instead of the lower and upper conductive layers 120 and 130.

According to the present invention, the spacers constituting the closed loops are etched to form the spacer patterns having an open loop or line shape. Thereafter, the spacer patterns are used as the etch mask. Thus, the material patterns used at the semiconductor substrate may be finely formed. Therefore, a highly-integrated semiconductor device may be efficiently fabricated. The invention being thus described, it will be obvious that the same may be varied in many ways. Such variations are not to be regarded as a departure from the spirit and scope of the invention, and all such modifications are intended to be included within the scope of the present invention.

What is claimed is:

1. A method of forming fine patterns of a semiconductor integrated circuit, comprising:

forming a mask layer over a semiconductor structure having a first region and a second region;

removing a portion of the mask layer over the first region to expose the semiconductor structure;

forming sacrificial layer patterns over the exposed semiconductor structure;

forming spacers on sidewalls of the sacrificial layer patterns and the mask layer;

simultaneously removing portions of the spacers and the mask layer to create the fine mask patterns in the first region and device mask patterns in the second region; and patterning the semiconductor structure using the fine mask patterns and the device mask patterns to create the fine patterns in the first region and device patterns in the second region.

2. The method of claim 1, wherein the semiconductor structure includes a semiconductor substrate, an insulating layer formed over the semiconductor substrate, and a conductive layer formed over the insulating layer.

3. The method of claim 1, wherein the forming spacers step forms spacers having a same height as the mask layer.

4. The method of claim 1, wherein the forming spacers step forms the spacers as loop structures; and the removing step removes portions of each loop structure to create fine mask patterns separated from one another.

5. The method of claim 4, wherein the removing step removes a portion of the loop structure formed on a sidewall of the mask layer.

6. The method of claim 1, wherein the spacers are formed of a material having etch selectivity with respect to the sacrificial patterns.

7. The method of claim 1, wherein the forming spacers step comprises:
   forming a spacer layer over the semiconductor structure; and
   anisotropically etching the spacer layer to expose a top surface of the sacrificial layer patterns.

8. The method of claim 7, wherein the forming a spacer layer step forms the spacer layer using one of atomic layer deposition and chemical vapor deposition.

9. The method of clam 1, prior to the patterning step, further comprising:
   removing the sacrificial layer patterns.

10. The method of claim 9, wherein the removing the sacrificial layer patterns step removes the sacrificial layer patterns using an etch recipe having an etch selectivity with respect to the spacers.

11. The method of claim 1, wherein the sacrificial layer patterns are formed of silicon oxide.

12. The method of claim 11, wherein the spacers are formed of silicon nitride.

13. The method of claim 12, wherein the mask layer is formed of silicon nitride.

14. The method of claim 1, wherein the mask layer and spacers are formed of silicon nitride.

15. The method of claim 1, wherein
   the removing step removes portions of the spacers and the mask layer such that at least one of the fine mask patterns form a continuous pattern with at least one of the device mask patterns; and
   the patterning step results in at least one fine pattern connected to at least one device pattern.

16. The method of claim 1, wherein at least one device pattern is a gate pattern.

17. The method of claim 1, wherein the forming sacrificial layer patterns step comprises:
   forming a sacrificial layer over the semiconductor structure; and
   planarizing the sacrificial layer to expose a top surface of the mask layer.

18. The method of claim 17, wherein the planarizing step is performed by chemical mechanical polishing.

19. The method of claim 1, wherein the first region is a cell array region and the second region is a peripheral circuit region.

20. A method of forming fine patterns of a semiconductor integrated circuit, comprising:
   forming sacrificial layer patterns over a first region of a semiconductor structure defined by a mask layer over a second region of the semiconductor structure;
   forming spacers on sidewalls of the sacrificial layer patterns and the mask layer;
   simultaneously removing portions of the spacers and the mask layer to create fine mask patterns in the first region and device mask patterns in the second region; and
   patterning the semiconductor structure using the fine mask patterns and device mask patterns to create fine patterns in the first region and device patterns in the second region.

* * * * *